(12) United States Patent
Mayer et al.

(10) Patent No.: US 11,349,471 B2
(45) Date of Patent: May 31, 2022

(54) SMART ELECTRONIC SWITCH

(71) Applicant: Infineon Technologies AG, Neubiberg (DE)

(72) Inventors: Alexander Mayer, Treffen (AT); Robert Illing, Finkenstein (AT); Marco Faricelli, Villach (AT)

(73) Assignee: Infineon Technologies AG, Neubiberg (DE)

( * ) Notice: Subject to any disclaimer, the term of this patent is extended or adjusted under 35 U.S.C. 154(b) by 38 days.

(21) Appl. No.: 16/922,949

(22) Filed: Jul. 7, 2020

(65) Prior Publication Data

US 2021/0028780 A1    Jan. 28, 2021

(30) Foreign Application Priority Data

Jul. 24, 2019   (DE) .......................... 102019119973.5

(51) Int. Cl.
*H03K 17/08*        (2006.01)
*H03K 17/0814*     (2006.01)
(Continued)

(52) U.S. Cl.
CPC ... *H03K 17/08142* (2013.01); *H03K 17/0828* (2013.01); *G01R 19/0092* (2013.01);
(Continued)

(58) Field of Classification Search
CPC ................. H03K 17/81; H03K 17/082; H03K 3027/0806; G01R 19/0092
See application file for complete search history.

(56) References Cited

U.S. PATENT DOCUMENTS 6,144,085 A    11/2000 Barker
7,279,765 B2   10/2007 Ahn et al.
(Continued)

FOREIGN PATENT DOCUMENTS

DE    102004063946 A1    3/2006
DE    102016100498 A1    7/2016
(Continued)

OTHER PUBLICATIONS

Oppenheim et al., Chapter 6, Section 6.3 Basic Structures for HR Systems, "Discrete-Time Signal Processing," 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).
(Continued)

*Primary Examiner* — Harry R Behm
(74) *Attorney, Agent, or Firm* — Shumaker & Sieffert, P.A.

(57) ABSTRACT

An integrated circuit is described herein. In accordance with one embodiment the circuit includes a transistor coupled between a supply pin and an output pin, a current output circuit configured to provide a diagnosis current at an current output pin, a current sensing circuit coupled to the transistor and configured to generate a first current sense signal indicative of a load current passing through the transistor and a second current sense signal indicative of the load current. The current output circuit is configured to select, dependent on a control signal, one of the following as diagnosis current: the first current sense signal and the second current sense signal.

10 Claims, 9 Drawing Sheets

(51) Int. Cl.
  *H03K 17/082* (2006.01)
  *H03K 17/687* (2006.01)
  *G01R 19/00* (2006.01)
(52) U.S. Cl.
  CPC ............... *H03K 2017/0806* (2013.01); *H03K 2017/6875* (2013.01)

(56) References Cited

U.S. PATENT DOCUMENTS

| | | | |
|---|---|---|---|
| 7,489,855 | B2 | 2/2009 | Kraus |
| 9,413,352 | B2 | 8/2016 | Lim |
| 9,672,201 | B1 | 6/2017 | Uszkoreit et al. |
| 9,887,532 | B2 | 2/2018 | Djelassi et al. |
| 10,305,363 | B1 | 5/2019 | Chen et al. |
| 2002/0024376 | A1 | 2/2002 | Sander |
| 2005/0184715 | A1 | 8/2005 | Kidokoro et al. |
| 2005/0270869 | A1 | 12/2005 | Krischke et al. |
| 2007/0008744 | A1 | 1/2007 | Heo et al. |
| 2012/0194119 | A1 | 8/2012 | Kroeze et al. |
| 2013/0301175 | A1 | 11/2013 | Posat |
| 2014/0078629 | A1 | 3/2014 | Cortigiani et al. |
| 2014/0091384 | A1 | 4/2014 | Petruzzi et al. |
| 2017/0063077 | A1 | 3/2017 | Donath et al. |
| 2017/0063367 | A1* | 3/2017 | Tsurumaru ............... H02P 27/08 |
| 2017/0294772 | A1 | 10/2017 | Illing et al. |
| 2017/0294918 | A1 | 10/2017 | Illing et al. |
| 2017/0294922 | A1 | 10/2017 | Illing et al. |
| 2017/0366116 | A1 | 12/2017 | Ogawa et al. |
| 2018/0048140 | A1* | 2/2018 | Takuma ................... B60R 16/02 |
| 2018/0248351 | A1* | 8/2018 | Vail ........................... H02H 1/04 |
| 2018/0287365 | A1 | 10/2018 | Djelassi-Tscheck et al. |
| 2020/0021207 | A1 | 1/2020 | Donat et al. |
| 2020/0132725 | A1* | 4/2020 | Krummenacher ..... G01R 1/203 |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

Infineon Technologies AG, "BTN8962TA High Current PN Half Bridge NovalithIC™," Data Sheet, Rev. 1.0, May 17, 2013, 26 pp.

International Standard ISO 7637-2, Third Edition, Mar. 1, 2011, entitled "Road vehicles-Electrical disturbances from conduction and coupling-Part 2: Electrical transient conduction along supply lines only," 48 pp.

International Standard ISO 26262-1, Second Edition, Dec. 2018, entitled "Road vehicles—Functional safety—Part 1: Vocabulary," 42 pp.

Office Action, in the German language, from counterpart German Application No. DE 10 2019 119 973.5 dated Apr. 1, 2020, 7 pp.

* cited by examiner

SMART ELECTRONIC SWITCH

This application claims priority to German Patent Application Number 102019119973.5, filed Jul. 24, 2019, the entire content of which is incorporated herein by reference.

TECHNICAL FIELD

The present disclosure relates to the field of smart semiconductor switches.

BACKGROUND

Almost every electric installation (e.g. in an automobile, in a house, electric subsystems of larger installations) include one of more fuses to provide over-current protection. Standard fuses include a piece of wire which provides a low-ohmic current path as long as the current passing through the fuse is below a nominal current. However, the piece of wire is designed to heat up and melt or vaporize when the current passing through the fuse exceeds the nominal current for a specific time and therefore, once triggered, a fuse has to be replaced by a new one.

Fuses are being increasingly replaced by circuit breakers. A circuit breaker is an automatically operated electric switch designed to protect an electric circuit from damage caused by overcurrent or overload or short-circuit. Circuit breakers may include electro-mechanical relays, which are triggered to disconnect the protected circuit from the supply when an over-current (i.e. a current exceeding the nominal current) is detected. In many applications (e.g. in the on-board power supply of an automobile), circuit breakers may be implemented using an electronic switch (e.g. a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually, the switching state (on/off) of electronic switches such as MOS transistors is controlled using so-called driver circuits or simply drivers (gate drivers in case of MOS transistors).

However, at least in some electronic circuit breakers (electronic fuses or e-fuses) common driver circuits may be inadequate with regard to fault tolerance and functional safety, which may be an issue particularly in automotive applications in which standards concerning functional safety must be complied with (e.g. ISO 26262). In fact, an electronic fuse needs to be more than just a classical fuse with an electronic switch. A robust implementation of an electronic fuse entails various challenges.

SUMMARY

An integrated circuit is described herein. In accordance with one embodiment the circuit includes a transistor coupled between a supply pin and an output pin, a current output circuit configured to provide a diagnosis current at an current output pin, a current sensing circuit coupled to the transistor and configured to generate a first current sense signal indicative of a load current passing through the transistor and a second current sense signal indicative of the load current. The current output circuit is configured to select, dependent on a control signal, one of the following as diagnosis current: the first current sense signal and the second current sense signal.

Furthermore a method is described that, in accordance with one embodiment, includes establishing a load current path between a supply pin and an output pin by activating a transistor, generating a first current sense signal indicative of a load current passing through the transistor and a second current sense signal indicative of the load current, and selecting, dependent on a control signal, one of the following signals: the first current sense signal and the second current sense signal. The selected signal is provided as diagnosis current at an current output pin.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

Figure 1:
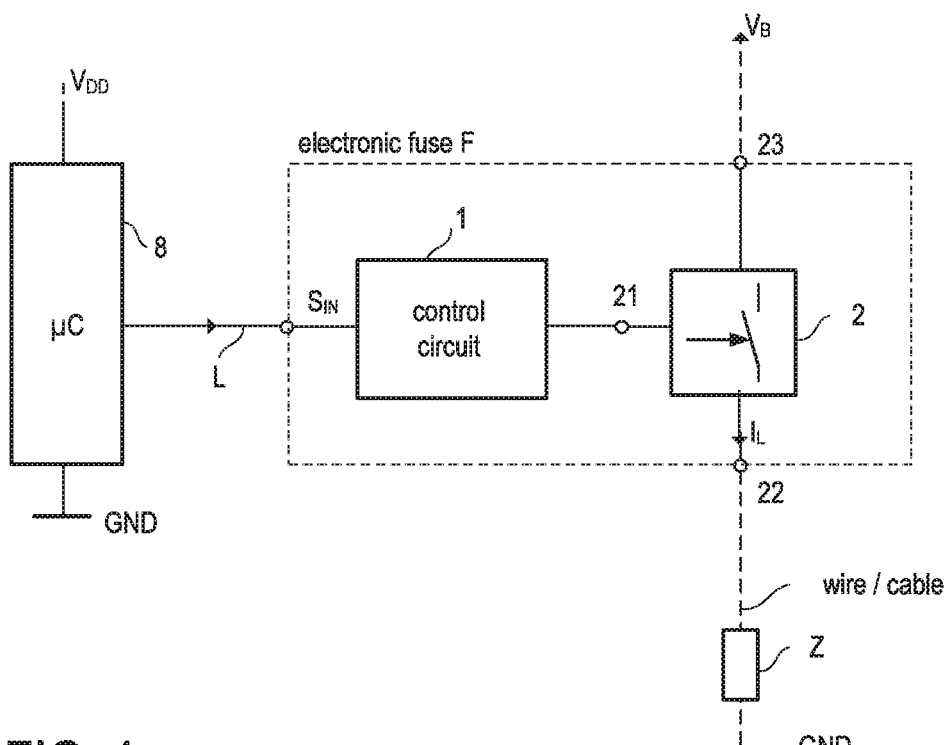
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit which may be operated as an electronic fuse. Therefore, the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated in one semiconductor die (chip) or may be integrated in two semiconductor dies that are arranged in one integrated circuit package. The electronic fuse circuit F is configured to drive a load Z (the wires connecting the load are illustrated in dashed lines in FIG. 1) that can be connected in series with the load current path of the electronic switch 2. Thus, the series circuit of the load current path of the electronic switch 2 and load Z may be connected between supply nodes, at which a positive supply potential and a negative supply potential or ground potential GND (zero volts) may be provided. In the following, a voltage between the two supply nodes is referred to as supply voltage $V_B$. The load current $i_L$ passing through the load Z may be switched on and off in accordance with an input signal $S_{IN}$ supplied to the control circuit 1, for example, by a micro controller 8. However, dependent on the application, the input signal $S_{IN}$ may be generated by any other circuitry instead of a micro controller.

In an exemplary application, the electronic fuse circuit F may be used to drive a load Z in an automobile. In this case, a power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. In the example illustrated in FIG. 1, the electronic switch 2 and the load Z are connected in a high-side configuration. That is, the load Z is connected between the electronic switch 2 and the ground node GND. This, however, is only an example. The electronic switch 2 and the load Z may also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g. included in a cable). Dependent on where the electronic circuit and the respective load Z are located within the electric installation of an automobile, the wire may have a considerable length of several 10 cm or even more (e.g. up to 10 m). A modern automobile includes a plurality of electric loads, so that a plurality of wires are required to connect the individual loads to their respective electronic switches. In order to save costs and resources, it may be desirable to dimension the individual wires such that they withstand, over a long term, a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z).

The current monitoring allows to switch off the electronic switch 2 in order to protect the wire (and the load Z) when an overload scenario is detected. An "overload scenario" is a scenario that may result in the wire or the load being damaged or destroyed if the electronic switch 2 is not switched off (within a specific time) to disconnect the wire (and the load Z) from the power source which provides the supply voltage $V_B$ (e.g. the automobile battery). This mechanism is explained in further detail herein below. As the electronic fuse circuit F is configured to switch on and off the load Z and to protect the wire, it is also referred to as switching and protection circuit in the following.

In the example shown in FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state in which the electronic switch 2 is capable of conducting a current between the first load node 22 and the second load node 23. "Switched off" means that the electronic switch 2 is operated in an off-state in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, it may also be possible that the functions of the individual functional blocks are performed by a programmable circuit (processor) which is configured to execute software/firmware stored in a memory.

Figure 2:
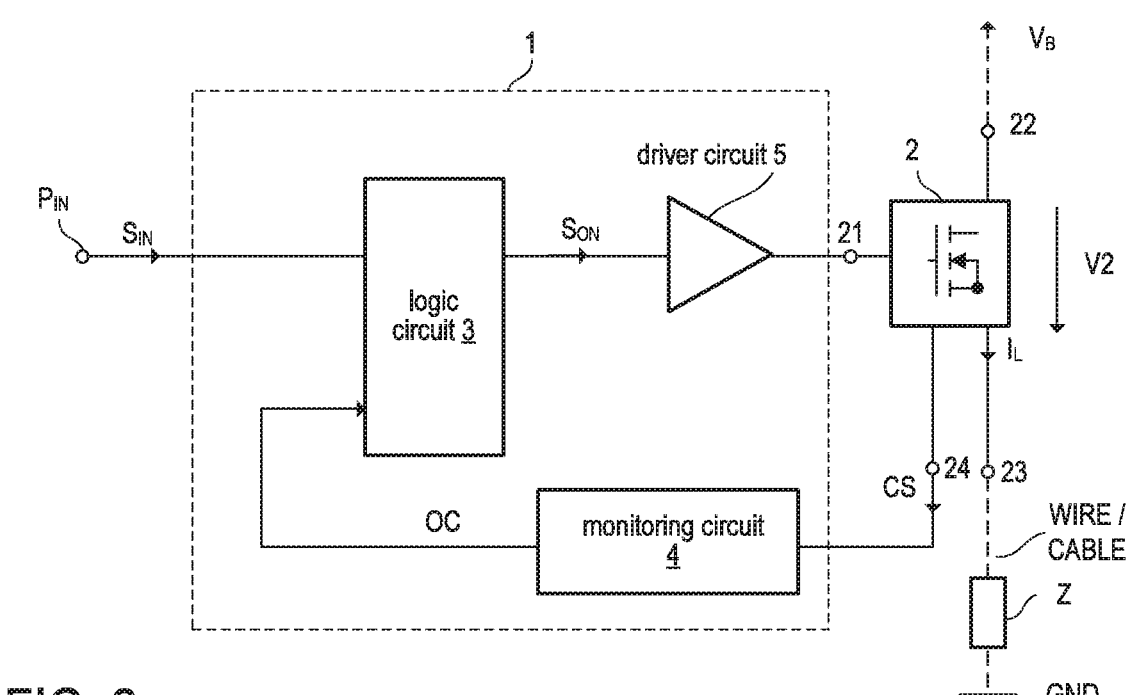
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a first protection signal OC based on a current-time-characteristic of the load current $i_L$. The expression "to generate the first protection signal OC based on the current-time-characteristic of the load current $i_L$" may include that the monitoring circuit 4 processes an instantaneous current amplitude of the load current $i_L$ as well as previous current amplitudes to generate the first protection signal OC. That is, the monitoring circuit 4 evaluates the load current $i_L$ over a certain time period in order to generate the first protection signal OC. To evaluate the load current $i_L$ the monitoring circuit 4 receives a current sense signal CS and generates the first protection signal OC based on the current sense signal CS. The current sense signal CS represents the load current $i_L$ and, according to one example, may be proportional to the load current $i_L$. In the example of FIG. 2, the current sense signal CS is available at a sense output 24 of the electronic switch 2. In this case, a current measurement circuit configured to measure the load current $i_L$ and provide the current sense signal CS may be integrated in the electronic switch 2.

However, this is only an example. A current measurement circuit separate from the electronic switch 2 may be used as well. Various current sense circuits (e.g. shunt resistors, Sense-FET circuits, etc.) are known and are thus not further explained herein in more detail. One specific example of a current sense circuit is included in FIG. 8 and will be discussed further below.

The control circuit 1 illustrated in FIG. 2 is configured to drive the electronic switch 2 based on the protection signal OC and an input signal $S_{IN}$ received at a first input node (e.g. input pin) $P_{IN}$ of the electronic fuse circuit F. The protection signal OC as well as the input signal $S_{IN}$ are supplied to a logic circuit 3, which generates a drive signal $S_{ON}$ based on the protection signal OC and the input signal $S_{IN}$. The drive signal $S_{ON}$ is directly or indirectly (e.g. via driver circuit 5) supplied to the control node 21 of the electronic switch 2 in order to switch the electronic switch 2 on or off. According to one example, the drive signal $S_{ON}$ may be a logic signal that has an on-level indicating when it is desired to switch the electronic switch 2 on or an off-level indicating when it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor, such as a MOSFET (as schematically illustrated in FIG. 2). A MOSFET is a voltage controlled semiconductor device that switches on or off dependent on a drive voltage applied between a gate node and a source node. In this example, the driver 5 is configured to generate the drive voltage (gate voltage $V_G$) based on the drive signal $S_{ON}$ in order to switch on or off the MOSFET in accordance with the drive signal. When MOSFETs are used, the driver 5 is also referred to as gate driver.

Figure 3:
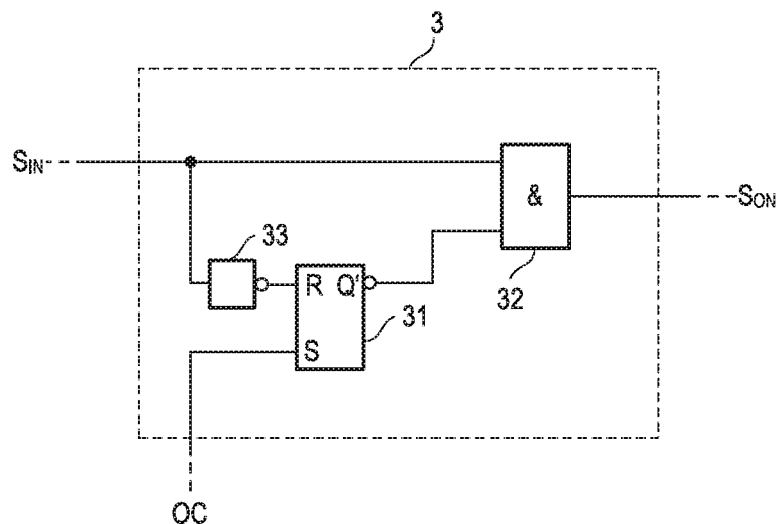
FIG. 3 illustrates one example of a logic circuit used in the control circuit of FIG. 2.

The circuit of FIG. 3 illustrates one exemplary implementation of (a part of) the logic circuit 3. In the present example, the logic circuit 3 includes an inverter 33, an SR latch 31 (flip-flop) and an AND gate 32. A first input of the AND gate 32 is configured to receive the input signal $S_{IN}$, whereas a reset input R of the SR latch 31 is configured to receive the inverted input signal provided by inverter 33. The set input S of the SR latch 31 is configured to receive the first protection signal OC. The inverting output Q' of the SR latch 31 is connected with a second input of the AND gate 32. The drive signal $S_{ON}$ is provided at the output of the AND gate 32.

Figure 4:
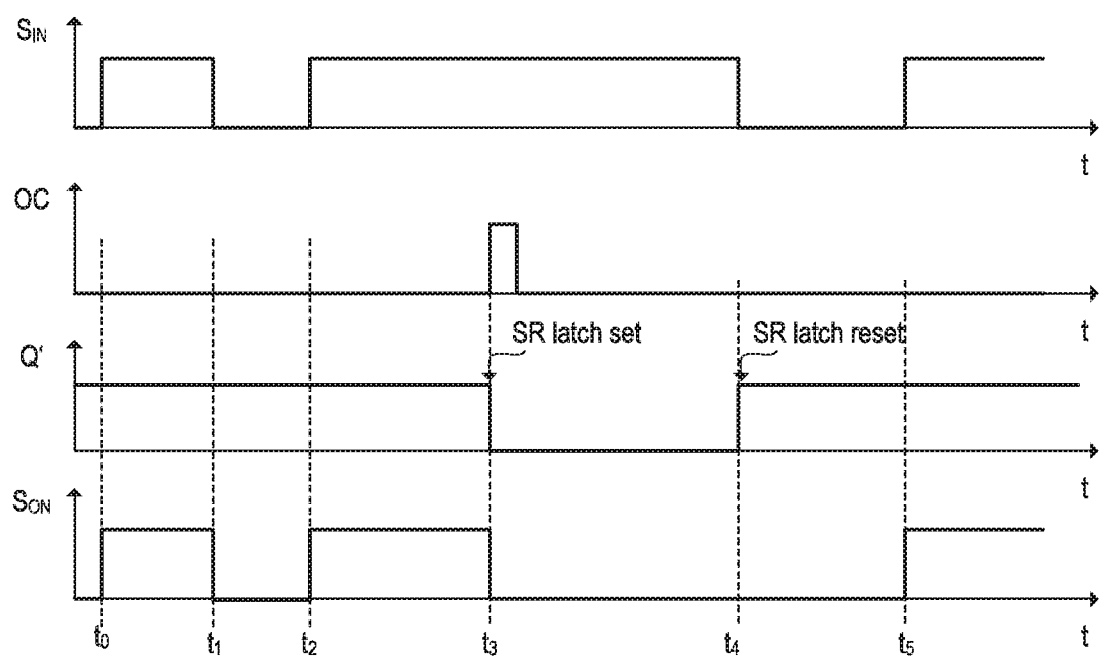
FIG. 4 shows timing diagrams illustrating the function of the control circuit shown in FIG. 2.

The function of the logic circuit 3 is further illustrated by the timing diagrams of FIG. 4. The initial low level of input signal $S_{IN}$ causes a reset of the SR latch 31, which results in a high level at the inverting output Q' of the SR latch 31. Accordingly, both inputs of the AND gate 32 "see" a high level, and thus the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input, and thus the output of the AND gate 32 provides the drive signal $S_{ON}$ with a low-level. In other words, the input signal $S_{IN}$ is fed through the logic circuit 3 (i.e. the drive signal $S_{ON}$ equals the input signal $S_{IN}$) provided that the SR latch 31 is in its reset state. Once the SR latch 31 is set by the first protection signal OC changing to a high-level, the inverting output Q' of the SR latch 31 is set to a low level (see FIG. 4, time instant $t_3$). Accordingly, the AND gate 32 sees a low level at its second input and thus the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2 and a reset of SR latch 31, see FIG. 4, time instant $t_4$) and again to a high level (indicating a switch-on of the electronic switch 2, see FIG. 4, time instant $t_5$). It is again noted that the function of the exemplary implementation of FIG. 3 may be implemented in various ways.

Figure 5A:
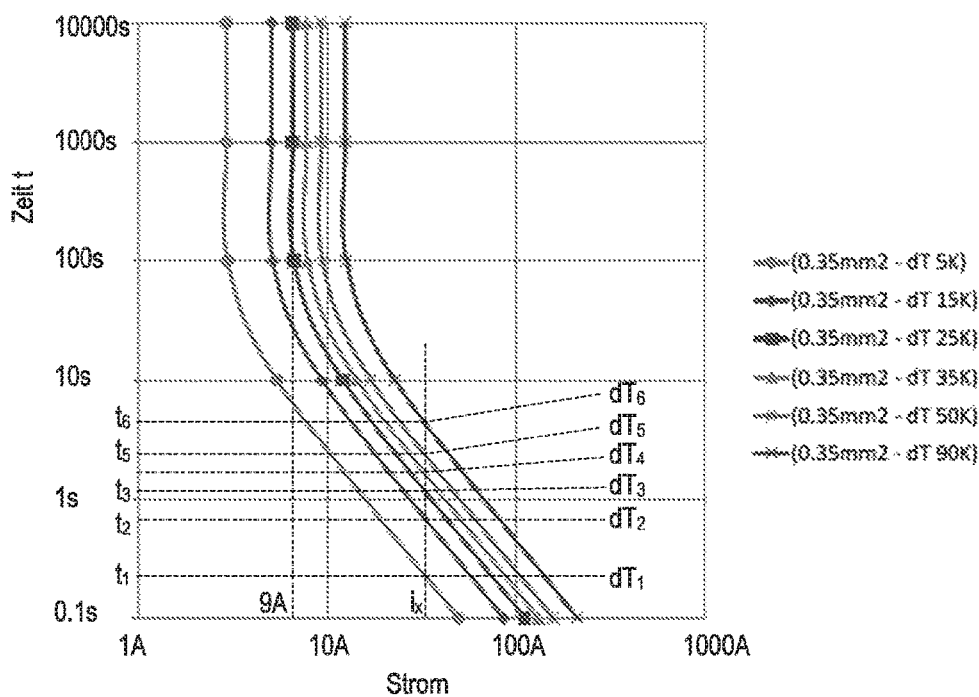
FIG. 5A is a diagram illustrating a family of characteristic curves (time over current) for a 0.35 mm$^2$ cable and for different maximum cable temperatures.
Figure 5B:
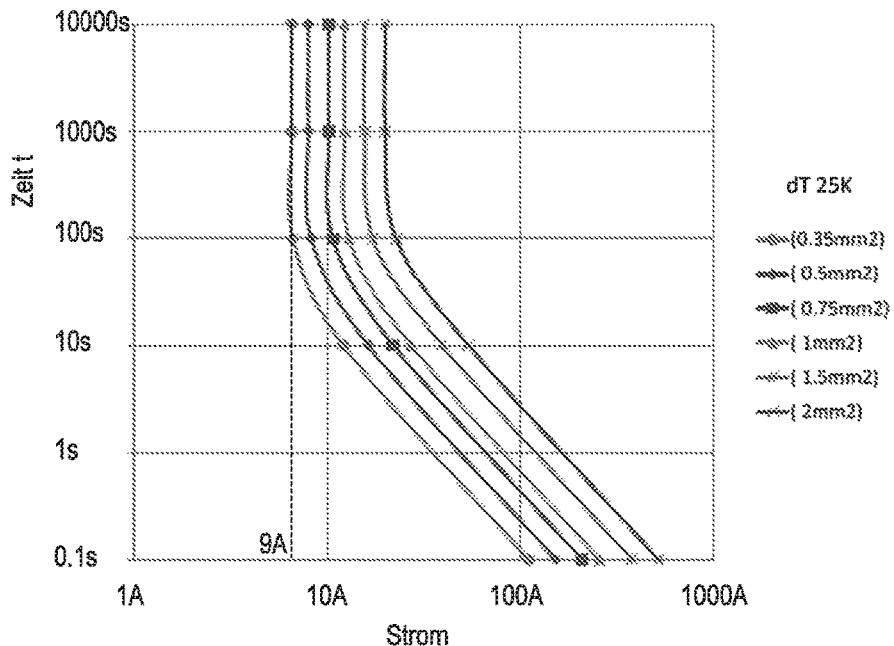
FIG. 5B is a diagram illustrating a family of characteristic curves (time over current) for a maximum cable temperature of 25 Kelvin above ambient temperature and for different cable cross-sections.

As mentioned above, it may be desired that the wire connecting load Z and electronic fuse circuit F withstand a nominal current of the load Z. The lifetime of a wire (or a cable) depends on the wire temperature. FIGS. 5A and 5B are diagrams showing a family of characteristic curves, wherein each characteristic curve is associated with a specific combination of maximum temperate difference dT (maximum temperature above ambient temperature) and cable cross section (e.g. cross-sectional area in $mm^2$). Each characteristic curve represents the relation between the current and the maximum allowable time period that the wire can carry the current without exceeding the maximum temperature difference. FIG. 5A includes characteristic curves for various temperature differences dT and a specific cross sectional area of 0.35 $mm^2$, while FIG. 5B characteristic curves for a specific temperature differences dT of 25 K (Kelvin) and various cross sectional areas. As can be seen from FIGS. 5A and 5B, a wire with a cross-sectional area of 0.35 $mm^2$ may carry a current of approximately 9 A (amperes) for a practically infinite length of time without exceeding a temperature difference dT of 25 K above ambient temperature. As can be seen from FIG. 5B, a wire with a cross-sectional area of 0.75 $mm^2$ may carry a current of 10 A (amperes) for approximately 100 seconds before exceeding a temperature difference dT of 25 K above ambient temperature. Generally, the higher the current, the shorter the allowable time period for a given cross-sectional area and a given temperature difference. It is noted that the characteristic curves shown in the diagrams of FIGS. 5A and 5B have a linearly falling branch in a double logarithmic representation.

As can be seen from FIGS. 5A and 5B, a temperature difference $dT_x$ (e.g. temperature values $dT_1$, $dT_2$, $dT_3$, $dT_4$, $dT_5$, $dT_6$) is associated with a given integration time $t_x$ (e.g. times $t_1$, $t_2$, $t_3$, $t_4$, $t_5$, $t_6$) for a given current (see FIG. 5A, current $i_x$) and a specific cross-sectional area (e.g. 0.35 $mm^2$ in the example of FIG. 5A). Hence, a temperature value dT (representing the temperature above ambient temperature) may be determined for a specific wire cross section by integrating the current $i_L=i_x$ passing through the wire over time, and the first protection signal OC may indicate a switch-off of the electronic switch 2 when the temperature value dT reaches a defined first reference temperature difference $dT_R$. The mentioned integration may be efficiently implemented using a digital filter that may be included in the monitoring circuit 4 (see FIG. 2). One exemplary implementation of a monitoring circuit is illustrated in FIG. 6.

Figure 6:
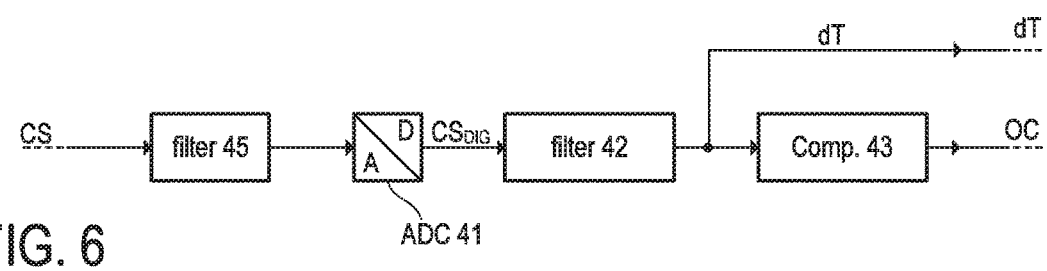
FIG. 6 illustrates one example of the monitoring circuit used in the example of FIG. 2

Basically, the monitoring circuit of FIG. 6 is configured to determine the first protection signal OC based on the current sense signal CS. As mentioned, the integration may be accomplished in digital filter 42 which has an integrating characteristic. According to the depicted example, the current sense signal CS, which may be a voltage that is proportional to the load current $i_L$, is supplied to the input of filter 45, which may be an (optional) analog low-pass filter, to remove transients or the like which have a comparable high frequency and/or to perform an anti-aliasing filter function. The output of filter 45 may be connected to the input of analog-to-digital converter (ADC) 41, which is configured to digitize the filtered current sense signal CS. The ADC 41 may have a logarithmic characteristic in order to account for the logarithmic characteristic curves shown in FIGS. 5A and 5B. The (e.g. logarithmized) digital current sense signal $CS_{DIG}$ is then converted to a temperature value dT by digital filter 42. The resulting temperature value dT (representing a temperature difference above ambient temperature) is then supplied to digital comparator 43, which may be configured to set the first protection signal OC to a high-level when the temperature value dT provided at the output of digital filter 42 exceeds the first reference temperature difference $dT_R$ (e.g. 25 K) specified for a specific wire cross-section. It is noted that, if the ADC 41 does not have a logarithmic characteristic, the digital current sense signal $CS_{DIG}$ should be squared before being supplied to the filter 42. In this regard, reference is made to FIG. 8 as well as to publication US20170294772A1, in which this concept of temperature calculation is described.

As mentioned, the digital filter 42 is configured to convert the load current $i_L$ (represented by the digitized current sense signal $CS_{DIG}$) and an associated integration time, during which the current passes through the wire, into a temperature value. In the present example, the filter characteristic 42 depends on a parameter characterizing the wire, e.g. the cross-sectional area of the wire, which carries the load current and which may be represented by a family of characteristic curves such as those shown in the diagram of FIG. 5A (for an exemplary cross-sectional area of 0.35 mm$^2$). In one specific example, the characteristic curves (or related curves) may be stored as a look-up table, i.e. by storing a plurality of sampling points of the characteristic curves in a memory. Values between two sampling points may be determined using, e.g. interpolation.

Conventional fuses are produced for a specific trigger current and with a specific trigger time (slow blow fuses, medium blow fuses, fast blow fuses), wherein the trigger time corresponds to a specific combination of reference temperature $dT_R$ and wire cross-section A as explained above (see FIGS. 5A and 5B). It would be desirable, however, to have a configurable fuse, which may be used for various wire parameters such as, for example, wire cross-sections and reference temperature values $dT_R$ (maximum temperature above ambient temperature).

Figure 7:
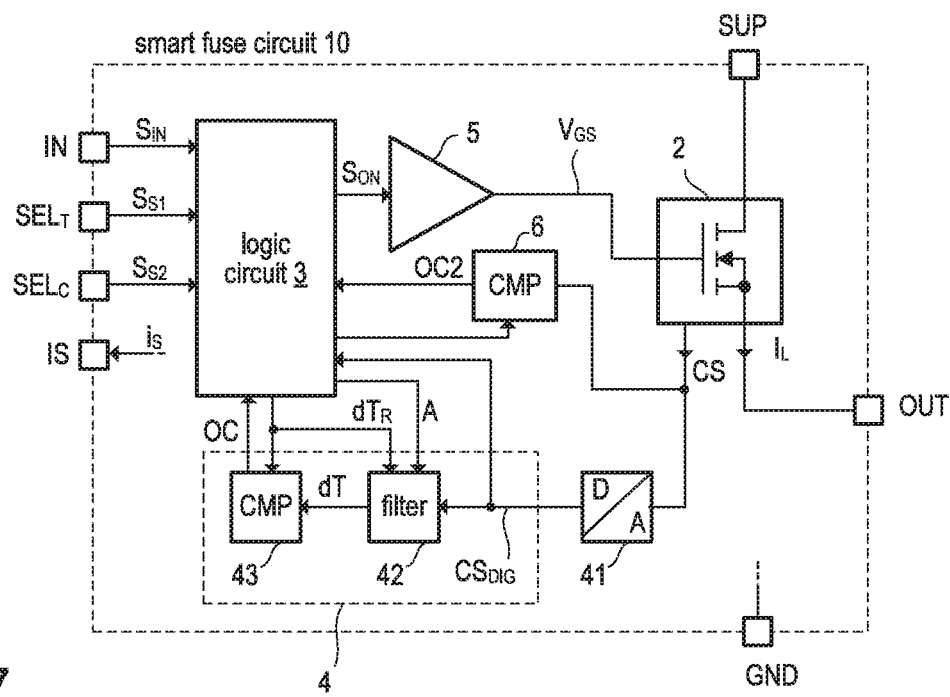
FIG. 7 illustrates a first example of an e-fuse ("smart fuse") circuit, which allows for the selection of wire cross section and maximum cable temperature.

FIG. 7 illustrates one example of an electronic fuse circuit which is further referred to as smart fuse circuit 10. The circuit of FIG. 7 is substantially the same as the circuit of FIG. 2 and reference is made to the respective description. However, the logic circuit 3 is more sophisticated than in the example of FIG. 2 and the monitoring circuit 4 may be, for example, implemented in accordance with FIG. 6, in which the analog low-pass filter 45 has been omitted (the low-pass filter 45 is optional). However, different from the example in FIG. 6, the monitoring circuit 4 is configurable in the present example so that its characteristic can be selected based on at least one wire parameter, which allows, for example, to select a characteristic curve (see FIGS. 5A and 5B) for a specific wire cross-section and/or a desired reference temperature difference $dT_R$. In the examples described herein, the at least one wire parameter is or represents the cable cross-sectional area and/or the maximum temperature value above ambient temperature or both. As can be seen in the diagrams of FIGS. 5A and 5B, these two wire parameters define a specific characteristic curve, which represents the desired behavior of the electronic fuse circuit for a specific wire/cable. It is understood that other parameters such as wire diameter or absolute temperature (e.g. in case ambient temperature is measured) may be used as wire parameters. Furthermore, a wire parameter is not necessarily proportional to any physical quantity (such as cross-sectional area or temperature) but can be a mere numerical parameter, which allows determining (e.g. selecting) a desired characteristic curve used by the monitoring circuit from a set of characteristic curves (see FIGS. 5A and 5B). As shown in FIG. 7, the electronic fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages. In the example of FIG. 7 all the depicted circuit components are integrated in one semiconductor chip.

The load current path of the electronic switch 2 may be connected between a supply pin SUP and an output pin OUT of the smart fuse circuit 10. Generally, the logic circuit 3 may be configured to receive at least one wire parameter, which, in the present example, includes information about a wire cross-sectional area A and a reference temperature difference $dT_R$, from a microcontroller or other control circuitry. As illustrated in FIG. 6, the logic circuit 3 may be configured to receive signals from a controller via input pin IN (input signal $S_{IN}$, see also FIG. 2) and input pins $SEL_T$ and $SEL_C$ (selection signals $S_{S1}$ and $S_{S2}$ representing) and to provide a drive signal $S_{ON}$ for the electronic switch 2. In the present example, the selection signal $S_{S1}$ is indicative of a specific one of a set of specific curves and thus represents a wire parameter. The selection signal $S_{S2}$ is indicative of a specific trip current which represents a maximum current $i_{TRIP}$ (trip current) used to trigger an over-current shutdown (implemented, e.g. using comparator 6). The driver 5 may be configured to convert the signal $S_{ON}$, which is a binary logic signal, into a drive voltage $V_{GS}$ (gate-source voltage) or a respective drive current suitable to switch the electronic switch 2 on and off. Like in the example of FIG. 2, the monitoring circuit 4 receives an (analog) current sense signal CS and generates, based on this current sense signal CS, the first protection signal OC, which may be processed by the logic circuit 3, for example, as shown in the example of FIG. 3.

Based on the information included in the at least one wire parameter and received, e.g., from the controller, the control logic 3 may configure the digital filter 42 and/or the comparator 43 so that the characteristic of the monitoring circuit 4 corresponds to a specific combination of wire cross-sectional area A and reference temperature difference $dT_R$. In the present example, the monitoring circuit 4 can be configured based on the selection signal $S_{S1}$ received at the input pin $SEL_T$. Thus the selection signal $S_{S1}$ may represent a parameter which is indicative of a desired wire (cross section and temperature difference). The ground pin GND shown in FIG. 4 is coupled to a reference potential, e.g. ground potential, and connected to the logic circuit 3, and other circuit components that need a reference potential for proper operation. It is understood that, in another embodiment, the wire parameter(s) may also be coded into a single (e.g. digital) selection signal, e.g. received by a digital communication interface such as a Serial Peripheral Interface (SPI). Further, it is understood that the specific mechanism of how the information concerning is provided to the logic circuit is not relevant. Basically, the monitor circuit 4 is configured to be suitable for a specific wire.

The above-mentioned comparator 6 may be used to implement an additional protection mechanism, which initiates an immediate over-current shutdown in response to detecting a load current $i_L$ equal to or greater than the maximum current ($i_L \geq i_{TRIP}$), which can be configured based on the selection signal $S_{S2}$ received at the input pin $SEL_C$. Accordingly, the comparator 6 signals to the logic circuit 3 to trigger an immediate over-current shutdown in response to detecting $i_L \geq i_{TRIP}$ by setting the second protection signal OC2 to an appropriate logic level (e.g. a high level). It is noted that this additional protection mechanism is independent from the selected characteristic curve and is primarily intended to protect the electronic switch 2 as such and not to protect the load and the wire. In other embodiments, the information about this parameter (maximum current/trip current $i_{TRIP}$) can be provided to the logic circuit, e.g. via a serial communication interface such as the mentioned SPI.

Figure 8:
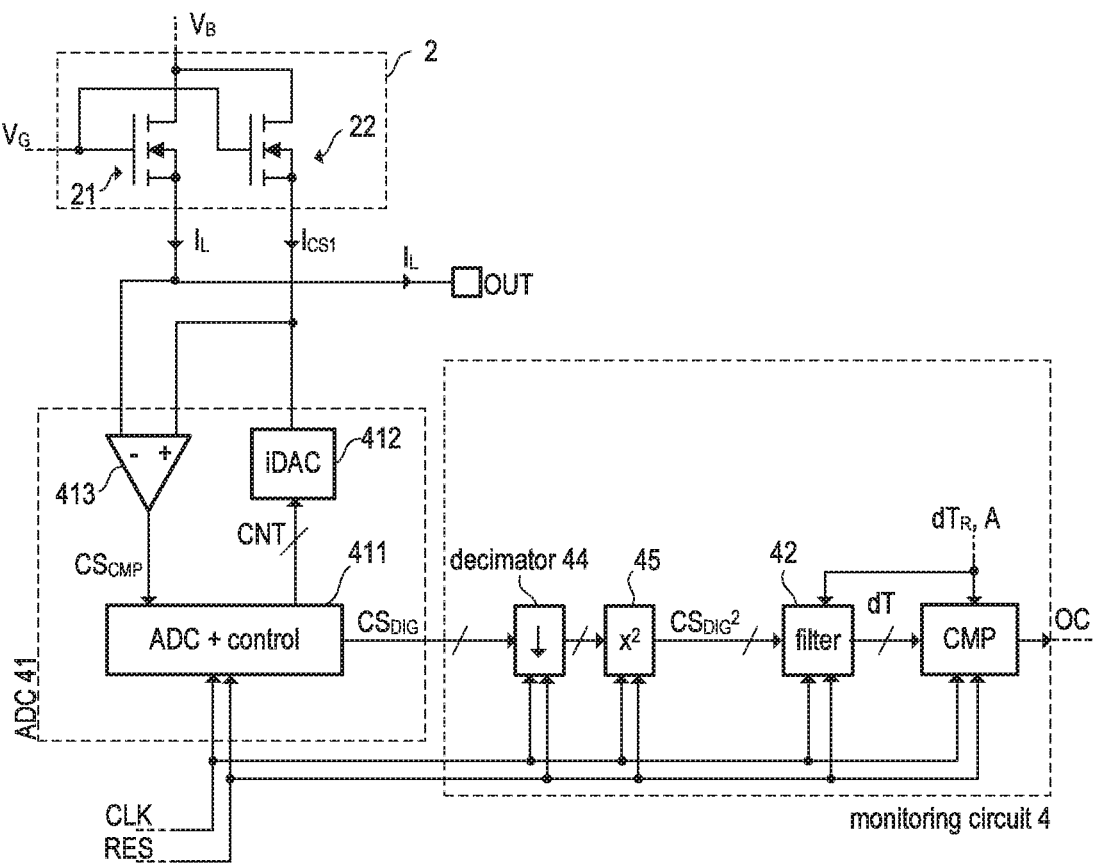
FIG. 8 illustrates one further example of the monitoring circuit used in the embodiment of FIG. 2.

FIG. 8 illustrates another exemplary embodiment of the monitoring circuit 4 in more detail. FIG. 8 also illustrates one example of how the current sensing may be implemented in more detail. For the purpose of current measurement, a so-called Sense-FET circuit is used. That is, the electronic switch actually includes two MOSFET transistors 21 and 22; transistor 21 is the actual load transistor that is coupled between a supply node (supply pin SUP) and output node (output pin OUT) and it carries the load current $i_L$, while transistor 22 is configured as a sense transistor that provides a sense current $i_{CS1}$, which is indicative of the load current $i_L$. The gate electrodes of load transistors 21 and sense transistor 22 are connected and receive the same gate voltage $V_G$. Similarly, the drain electrodes of load transistors 21 and sense transistor 22 are connected and receive the same drain voltage (supply voltage $V_B$ in case of a high-side configuration). The source current of the sense transistor is referred to as sense current $i_{CS1}$, which is substantially proportional to the load current $i_L$ (source current of load transistor 21) when the drain-source-voltages of both transistors 21, 22 are equal. In this case, the two transistors are operated in the same operating point and the ratio of the source currents $i_L/i_{CS1}$ equals the ratio $A_{21}/A_{22}$ of the active areas of transistor 21 and transistor 22.

The monitor circuit 4 of FIG. 8 receives the current sense signal, which is a digital signal $CS_{DIG}$ in the present example, from the current sense circuit. The current sense circuit basically includes the sense transistor 33 with the source current $i_{CS1}$ (sense current) and an analog-to-digital converter. According to the present example, the analog-to-digital converter (ADC) 41 may be a counter type ADC or a SAR (Successive Approximation Register) type ADC. Accordingly, the ADC 41 includes a control circuit 411, a current-output digital-to-analog converter (DAC) 412 and a comparator 413. The DAC 412 is basically a current source, which is controllable by a digital control signal provided by a digital register CNT included in the control circuit 411. The control circuit 411 is configured to modify the digital register CNT in accordance with a given scheme and the resulting analog current $i_{CS1}$ is drained from the source terminal of the sense transistor 22. That is, the output node of the current-output DAC 412 is connected to the source electrode of the sense transistor 22 and, thus, the source current of the sense transistor is essentially set by the DAC 412. The comparator 413 is configured to compare the source potentials (or drain-source voltages) of load transistor 21 and sense transistor 22 and indicates (by a level change at its output) when the source potentials are equal. In other words, the comparator 413 indicates when to sample the source current $i_{CS1}$ of the sense transistor 22. As mentioned, in this situation (transistors 21 and 22 having equal source potentials) the sense current $i_{CS}$ is proportional to the load current $i_L$ and, thus, the current value of register CNT represents the load current and is output as digital current sense signal $CS_{DIG}$. In a simple implementation, the control circuit 411 may basically include a counter that is regularly reset and adds up (thereby ramping up the DAC output current) until the comparator 413 indicates that the source potentials of transistors 21, 22 are equal. As mentioned, more sophisticated schemes (such as SAR) may be used to modify the register CNT.

Dependent on the implementation the monitoring circuit 4 may (optionally) include a decimator 44 to reduce the data rate of the digital data stream provided by the ADC 41 or to provide an averaging function. The monitoring circuit 4 may further include the squaring unit 45 configured to calculate the square of the digital current sense signal $CS_{DIG}$. The squaring unit 45 is optional and can be omitted when the ADC 41 has a logarithmic characteristic, as already mentioned above. In the example depicted in FIG. 8, the ADC 41 has a linear characteristic and the squared current sense signal $CS_{DIG}^2$ is filtered using a digital filter 42. The filter 42 may include an integrating characteristic as already discussed above and the filter output signal represents the cable temperature and indicates a temperature difference dT of the cable above ambient temperature. Digital comparator 43 is used to compare the temperature difference dT with a threshold and indicates an overcurrent (signal OC) when a reference temperature difference $dT_R$ is exceeded. It is noted that the digital circuitry included in monitor circuit 4 operates using a clock signal CLK and needs to be initialized to a specific initial state, which is usually done by a reset signal RES.

Figure 9:
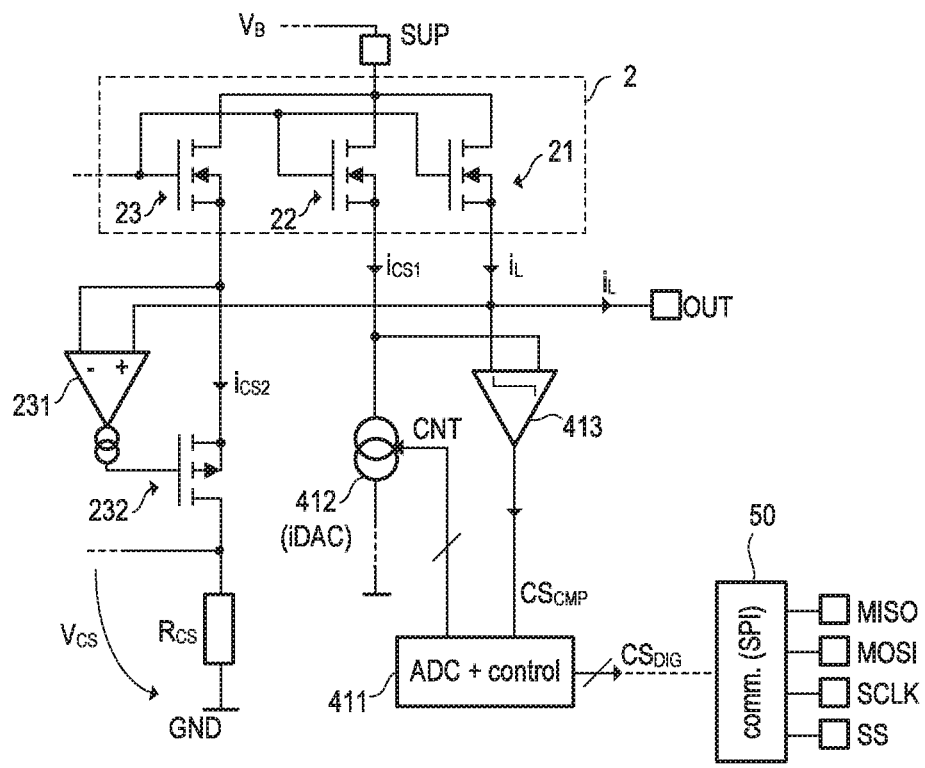
FIG. 9 illustrates a further example of a current sense circuit that may be used in connection with the monitoring circuit of FIG. 8 and provides redundant current sense signals.

FIG. 9 illustrates one further exemplary implementation of the current sense function. Basically, the current sense circuit shown in FIG. 9 is an enhancement of the current sense circuit included in FIG. 8, which has already been discussed further above. In the example of FIG. 9, a Sense-FET circuit is used, wherein the electronic switch 2 includes three MOSFET transistors 21, 22, and 23. Transistor 21 is the actual load transistor that is coupled between a supply node (supply pin SUP) and output node (output pin OUT) and it carries the load current $i_L$ (like in the example of FIG. 8); transistors 22 and 23 both are configured as sense transistors that provide a sense current $i_{CS1}$ and, respectively, $i_{CS2}$ which are indicative of the load current $i_L$, when the transistors operate at the same operating point (i.e. equal gate, drain, and source potentials). The gate electrodes of load transistors 21 and the sense transistors 22 and 23 are connected and receive the same gate voltage $V_G$. Similarly, the drain electrodes of load transistors 21 and the sense transistors 22 and 23 are connected and receive the same drain voltage (supply voltage $V_B$ in case of a high-side configuration). The source current of the sense transistor 22 is referred to as sense current $i_{CS1}$, and the source current of the sense transistor 22 is referred to as sense current $i_{CS2}$, both of which are substantially proportional to the load current $i_L$ (source current of load transistor 21) when the drain-source-voltages of the transistors 21, 22, and 23 are equal.

The parts on the right side of FIG. 9 (current output DAC 412, control circuit 411, and comparator 413) are the same as in the example of FIG. 8 and reference is to the respective description above. The control circuit 411 can operate as analog-to digital converter and generates a digital current sense signal $CS_{DIG}$, which is used, for example, calculate the temperature difference dT in the monitoring circuit. The parts on the left side of FIG. 9 (further transistor 232, resistor $R_{CS}$ and amplifier 231) are configured to perform a redundant current measurement. In the present example, the transistor 232 is a p-channel MOS transistor whose source electrode is connected to the source electrode of sense transistor 23, so that the source current $i_{CS2}$ of sense transistor 23 is also the source current of the further transistor 232. The first and second input of the amplifier 231 are connected to the source electrode of the load transistor 21 and the sense transistor 23, and the output of the amplifier 231 is connected to the gate electrode of the transistor 232. The amplifier 232 may be implemented as an operational transconductance amplifier (OTA) which drives the transistor 232 such that the difference between the source potentials of the load transistor 21 and sense transistor 23 approaches zero. As mentioned, in such a situation the sense current $i_{CS2}$ is proportional to the load current $i_L$ as the two transistors 21, 23 operate at the same operating point. The sense current $i_{CS2}$ passes the resistor $R_{CS}$, which is connected in series to the drain-source path of transistor 232. In the depicted example, the resistor $R_{CS}$ is connected between the drain electrode of transistor 232 and ground potential. The voltage drop $V_{CS}$ across the resistor $R_{CS}$ ($V_{CS}=R_{CS}\cdot i_{CS}2$) can be used as analog current sense signal and supplied to comparator 6 shown in FIG. 7. The comparator may be configured to compare the analog current sense signal $V_{CS}$ with a reference voltage $V_{REF}=R_{CS}\cdot i_{TRIP}/k_{ILIS}$. In this example $k_{ILIS}$ is the factor of proportionality between the load current $i_L$ and the sense current $i_{CS2}$ ($i_{CS2}=i_L/k_{ILIS}$), and $i_{TRIP}$ is the trip current used for over-current shutdown (when the condition $i_L \geq i_{TRIP}$ is detected).

It is noted that the analog current sense signal $V_{CS}$ may be supplied to the comparator 6 (see FIG. 7) which monitors the load current in order to trigger an over-current shutdown when the load current exceeds a specific maximum, whereas the digital current sense signal $CS_{DIG}$ may be processed in the monitoring circuit 4 in order to initiate a switch-off the electronic switch in accordance with a pre-selected characteristic curve for a specific wire. Additionally, the information about the measured load current can also be provided to an external circuit such as the external micro controller 8 (see FIG. 1). For this purpose the electronic fuse device may have a dedicated current output pin IS, at which a diagnosis current is can be provided which carries information such as the measured load current, the measured temperature, current parameter settings, etc. Additionally or alternatively, the electronic fuse may include a communication interface such as an SPI (Serial Peripheral Interface), which is configured to receive the digital information (e.g. digital signal $CS_{DIG}$) representing the load current and to transmit this information to a digital communication link. In the case of an SPI link, four pins MISO, MOSI, SCLK and SS are usually used. SPI is a well-known de-facto standard and is thus not further described here.

Figure 10:
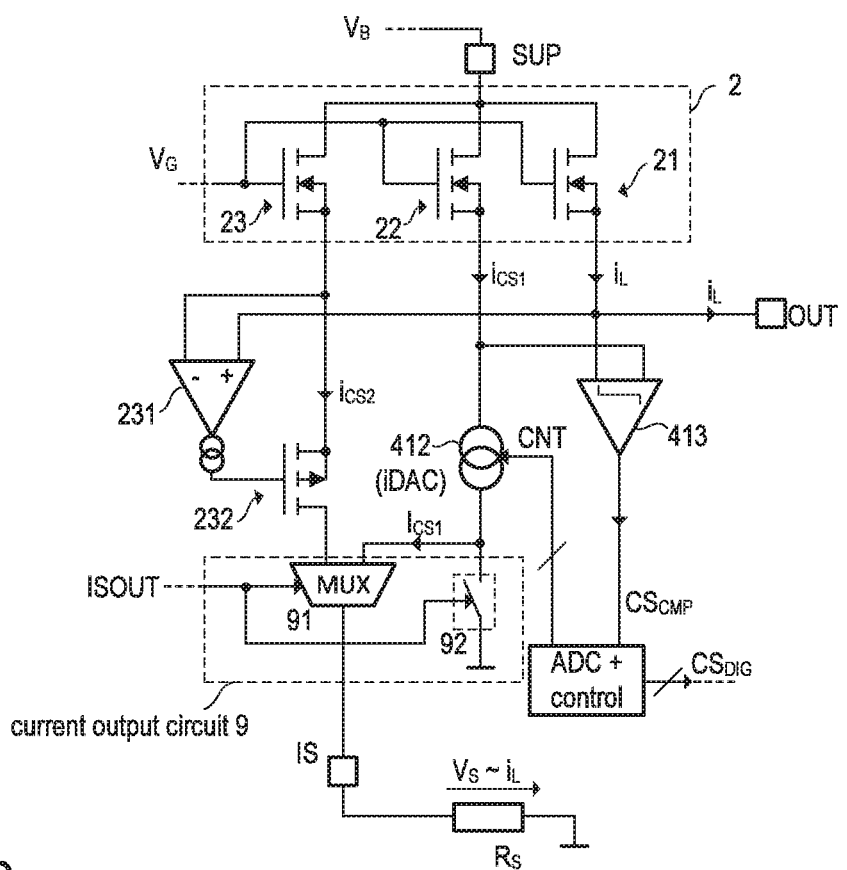
FIG. 10 illustrates one exemplary modification/enhancement of the previous example of FIG. 9.

FIG. 10 illustrates an example of a circuit that is capable of outputting either the analog sense current $i_{CS2}$ (analog current sense signal, labelled CS in FIG. 2) or the sense current $i_{CS1}$, which represents the digital current sense signal $CS_{DIG}$, at an output pin IS. The output current may generally be referred to as sense current is and converted into a respective voltage $V_S$ by draining the current is via a resistor $R_S$ as shown in FIG. 10. It is understood that the resistor $R_S$ is a component externally connected to the electronic fuse device at pin IS. However, the resistor may also be integrated in the electronic fuse device; in this case the pin IS would provide an diagnosis voltage instead of a diagnosis current.

The circuit of FIG. 10 is basically the same as the circuit in FIG. 9 and reference is made to the description above to avoid reiterations. However, the circuit of FIG. 10 additionally includes a current output circuit 9 that is configured to direct either the sense current $i_{CS1}$ or the sense current $i_{CS2}$ to the pin IS at which the current is output. The current output circuit 9 may include an analog multiplexer 91 that is configured to receive the sense currents $i_{CS1}$ and $i_{CS2}$ and to direct a selected one of these currents to the output pin IS. The selection may be made dependent on the level of a selection signal ISOUT, which may be generated, for example by the logic circuit 3 (see FIG. 7). In the depicted example, the current output circuit 9 also includes an electronic switch 92, which is closed when the current $i_{CS1}$ is not selected so that the current path is closed and the current $i_{CS1}$ can be drained to ground when the current path via pin IS is not available. In the present example, the current output circuit 9 is configured to directly output sense current $i_{CS2}$ or $i_{CS1}$. It is understood that, in other examples, current mirrors may be used to provide a mirror current equal to $i_{CS1}$ or $i_{CS2}$, and the mirror current may be output at pin IS. For the function of the current output circuit 9 it is not relevant whether the selected current is output directly or indirectly (e.g. via a current mirror).

Figure 11:
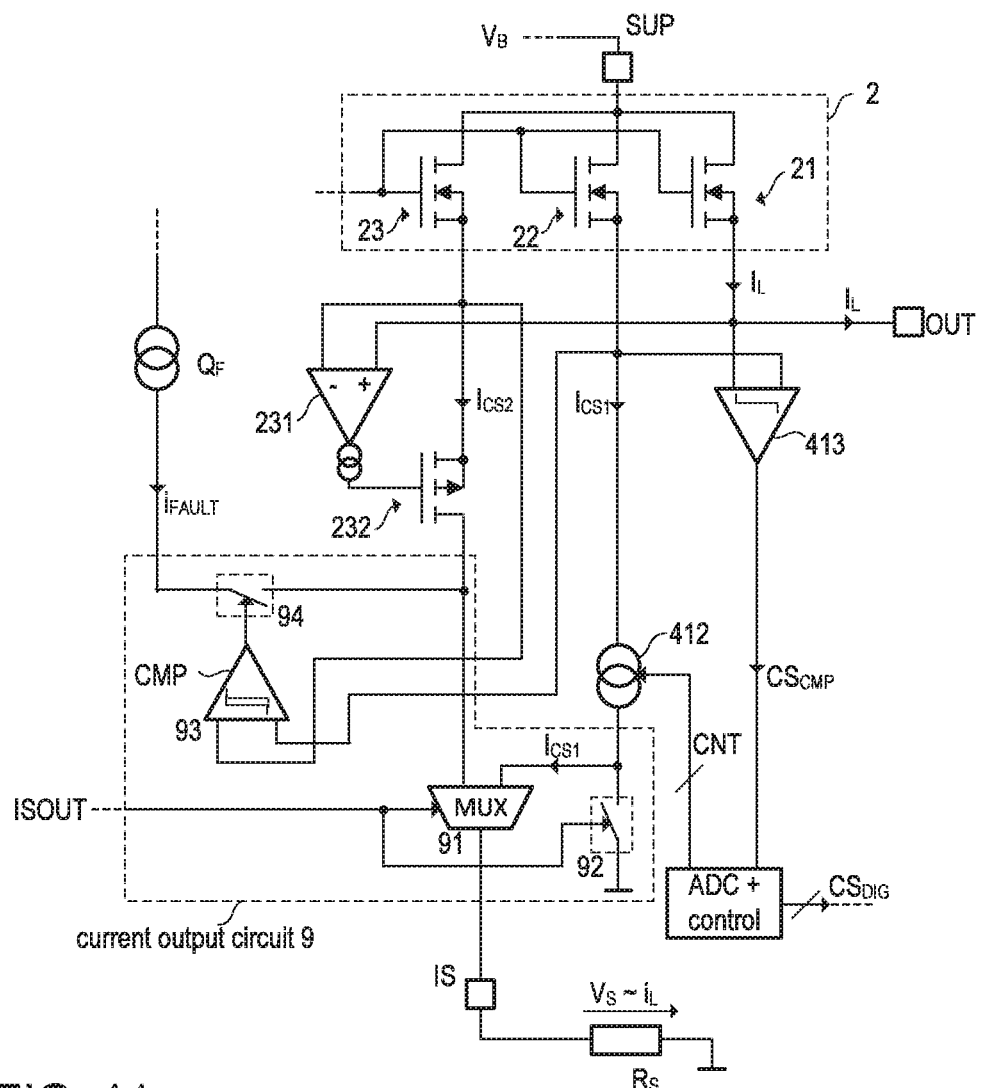
FIGS. 11-13 illustrates various modifications/enhancements of the previous example of FIG. 9 which allow checking the consistency of the redundant current sense signals.

The example of FIG. 11 may be regarded as an enhancement of the example of FIG. 10. Therefore, the circuit of FIG. 11 is basically the same as the circuit in FIG. 10 and reference is made to the description above to avoid reiterations. However, the circuit FIG. 11 includes an additional current source $Q_F$ which is configured to provide a current $i_{FAULT}$. This current $i_{FAULT}$ is supplied to the current output circuit, which is configured to output the current $i_{FAULT}$ at the pin IS in response to detecting an erroneous operation of, e.g., the current sense circuit.

In the present example of FIG. 11, an erroneous operation of the current sense circuit is detected when the difference between the source potentials of sense transistors 22 and 23 is more than a maximum allowable difference. For this purpose the current output circuit 9 may include a comparator 93 that is configured to detect when the source potential of sense transistor 22 deviates from the source potential of sense transistor 23 by more than a specified amount. Upon detecting such a deviation, the current source $Q_F$ may be connected to the multiplexer 9, which is accomplished, in the present example, by the electronic switch 94, which is driven by the output of comparator 93. When the switch 93 is closed, the current $i_{FAULT}$ is injected into the current path of sense current $i_{CS2}$, and therefore the multiplexer receives the sum current $i_{CS2}+i_{FAULT}$ instead of the sense current $i_{CS2}$ when the comparator detects an erroneous operation of the sense current circuit as discussed above.

In other words, the current $i_{FAULT}$ is an offset current added to sense current $i_{CS2}$ when the sense currents $i_{CS2}$ and $i_{CS1}$ are detected to be inconsistent. When the sense current $i_{CS2}$ is selected to be output at pin IS, an external circuitry connected to the pin IS may detect the offset current $i_{FAULT}$ and obtain information about the detected inconsistency/erroneous operation. It is understood that the current $i_{FAULT}$ is not necessarily output as offset current added to sense current $i_{CS2}$. Alternatively, the multiplexer 91 may be configured to select among the currents $i_{FAULT}$, $i_{CS2}$ and $i_{CS1}$, wherein $i_{FAULT}$ is selected when the mentioned inconsistency/erroneous operation is detected.

Figure 12:
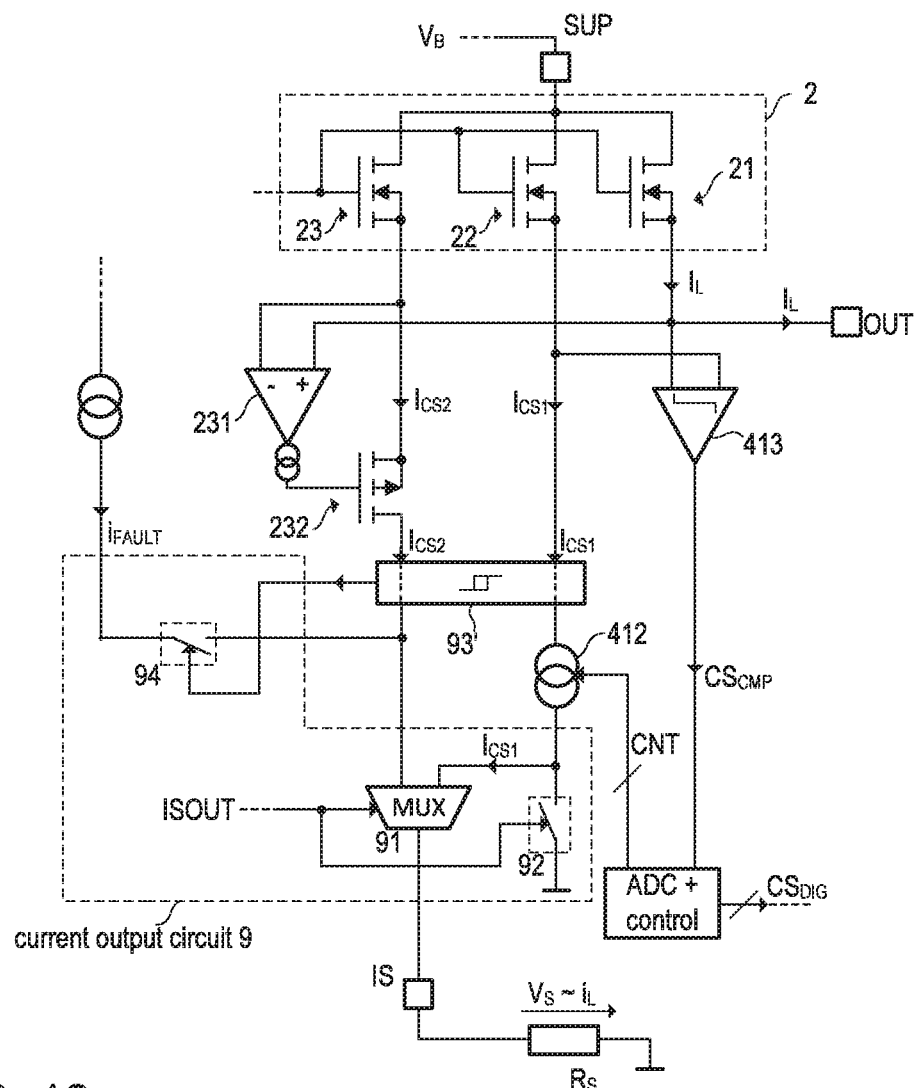

FIG. 12 illustrates a slight modification of the example of FIG. 11. The example of FIG. 12 is basically the same as the previous example and reference is made to the description above to avoid reiterations. FIGS. 12 and 11 essentially differ in the implementation of the current output circuit 9 and, in particular, in the way the feed-in of the current $i_{FAULT}$ is controlled. In essence, the voltage comparator 93 used in the example of FIG. 11 is replaced by the current comparator 93' shown in FIG. 12. Accordingly, the current comparator 93' is configured to detect when the current $i_{CS1}$ deviates from the current $i_{CS2}$ by more than a predetermined amount (e.g. a predefined percentage). Accordingly the current comparator 93' has the characteristics of a window comparator. In other words, the current comparator 93' may use two thresholds $i_{TH1}$ and $i_{TH2}$, namely, for example, $i_{TH1}=i_{CS2} \cdot (1-x/100)$ and $i_{TH2}=i_{CS2} \cdot (1-x/100)$, wherein x denotes a predetermined percentage. At its output, the current comparator 93' will indicate whether the condition $i_{TH1} < i_{CS1} < i_{TH2}$ is violated (i.e. whether $i_{CS1}$ deviates from $i_{CS2}$ by more than x %). If this is, the case, the switch 94 will be closed and the current $i_{FAULT}$ is added as offset current to $i_{CS2}$ as explained above with reference to FIG. 11.

Figure 13:
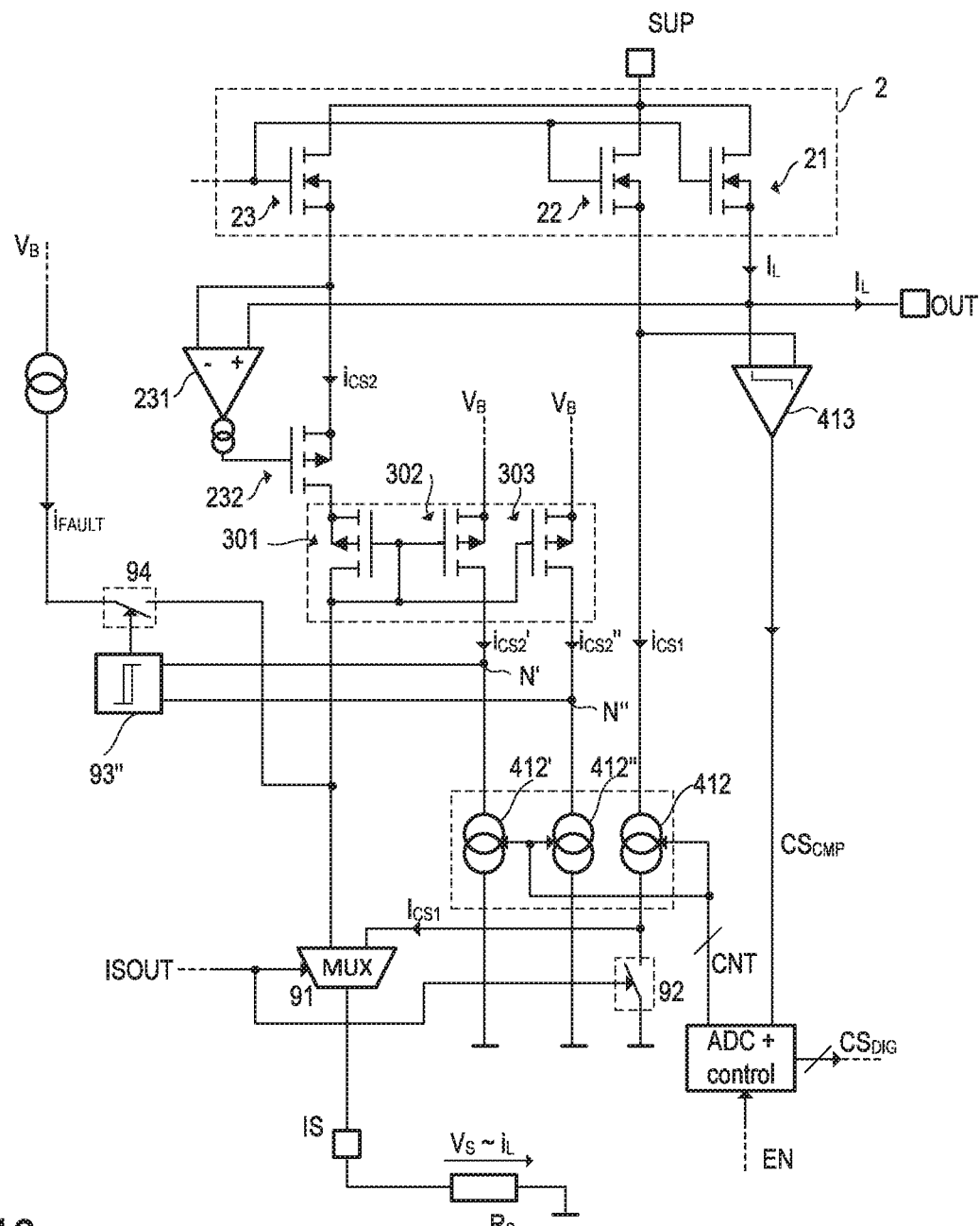

In the example of FIG. 13 one practical implementation of the current comparator 93' is illustrated, wherein the current comparator is implemented using current mirrors. The below description focusses on the current comparator as the remaining part of FIG. 13 is basically the same as FIG. 12. To implement the two thresholds $i_{TH1}$ and $i_{TH2}$, a first current mirror is provided which is composed of the transistors 301, 302, and 303. Transistor 301 forms the input transistor of the current mirror, i.e. the source-drain current path of transistor 301 is connected in series to the source-drain current path of transistor 232. The transistors 302 and 303 form two output transistors of the current mirror and provide the two mirror currents $i_{CS2}'$ and $i_{CS2}''$, respectively. The current mirror may be designed such that the ratio $i_{CS2}'/i_{CS2}$ is $1-x/100$ and the ratio $i_{CS2}''/i_{CS2}$ is $1-x/100$, wherein x corresponds to the above-mentioned predetermined percentage. The two output transistors 302 and 303 of the current mirror are connected in series to the current sources 412' and, respectively, 412", both of which are controllable current sources that are controlled to drain the same current as the current source 412 (current-output DAC). Accordingly, the current sources 412, 412' and 412" can also be regarded as a current mirror. It is noted that $i_{CS2}'$ and $i_{CS2}''$ correspond to the threshold currents $i_{TH1}$ and $i_{TH2}$ mentioned in the previous example.

In normal operation—i.e. when $i_{CS2}' < i_{CS1} < i_{CS2}''$—the potential of the common circuit node N' of current source 412' and transistor 302 will be pulled down (towards ground) and the potential of the common circuit node N" of current source 412" and transistor 303 will be pulled up (towards supply voltage $V_B$). In a situation in which $i_{CS2}' < i_{CS2}'' \leq i_{CS1}$ is valid, the potential of both circuit nodes N' and N" will be pulled down. Similarly, in a situation in which $i_{CS1} \leq i_{CS2}' < i_{CS2}''$ is valid, the potential of both circuit nodes N' and N" will be pulled up. Accordingly, the potential difference between circuit nodes N' and N" will only reach significant values in the first situation $i_{CS2}' < i_{CS1} < i_{CS2}''$. Comparator 93" is configured to detect when the potential difference between circuit nodes N' and N" drops to a low value, i.e. to detect when the condition $i_{CS2}' < i_{CS1} < i_{CS2}''$ for normal operation is violated. If this is the case, the switch 94 is closed, as in the previous examples, which results in the offset current $i_{FAULT}$ being added to the sense current $i_{CS2}$.

Figure 14:
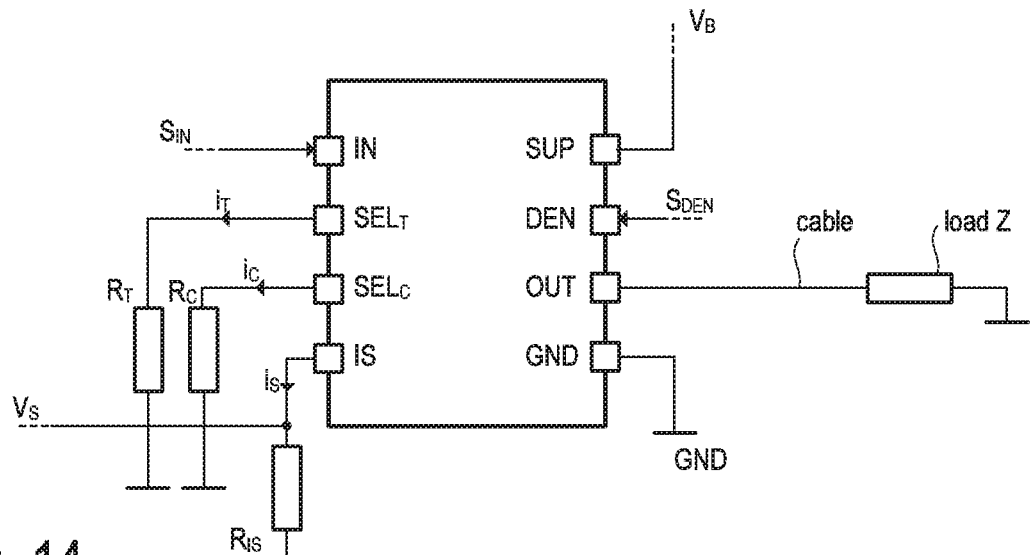
FIG. 14 illustrates one exemplary use of an e-fuse circuit and the circuitry connected externally thereto.

FIG. 14 illustrates one exemplary embodiment of how an electronic fuse circuit 10 (smart fuse circuit) can be used to protect a load. In particular, FIG. 14 includes the circuitry that is externally connected to the electronic fuse circuit 10 which is, in the present example, integrated in a single chip. The supply pin SUP is connected to a voltage supply (e.g. a battery terminal providing supply voltage $V_B$) and the ground pin GND is connected to a ground terminal. The input signal $S_{IN}$ supplied to the input pin IN is a logic signal whose logic level (high level or low level) is indicative of whether to switch the electronic switch 2 on or off. The load (represented by impedance Z) is connected to the output pin OUT via a wire. The selection signals $S_{S1}$ and $S_{S2}$ mentioned above may be generated by connecting resistors $R_T$ and $R_C$ to the input pins $SEL_T$ and $SEL_C$, respectively (see also FIG. 7). The electronic fuse circuit may include current sources providing defined constant currents $i_T$ and $i_C$ at the input pins at the input pins $SEL_T$ and $SEL_C$. These currents $i_T$ and $i_C$ are drained via the resistors $R_T$ and $R_C$ connected to the input pins $SEL_T$ and $SEL_C$ thereby causing respective voltage drops $i_T \cdot R_T$ and $i_C \cdot R_C$. These voltage drops form the mentioned selection signals $S_{S1}$ and $S_{S2}$ shown in the example of FIG. 7 and represent a desired wire characteristic (FIGS. 5A and 5B) to be selected and, respectively, a desired maximum current $i_{TRIP}$ to be used by the above-mentioned over-current shut-down function. The signal $S_{DEN}$, which is received on the input pin DEN (Diagnosis ENable pin), may be used to control which information is output at the current output pin IS.

Figure 15:
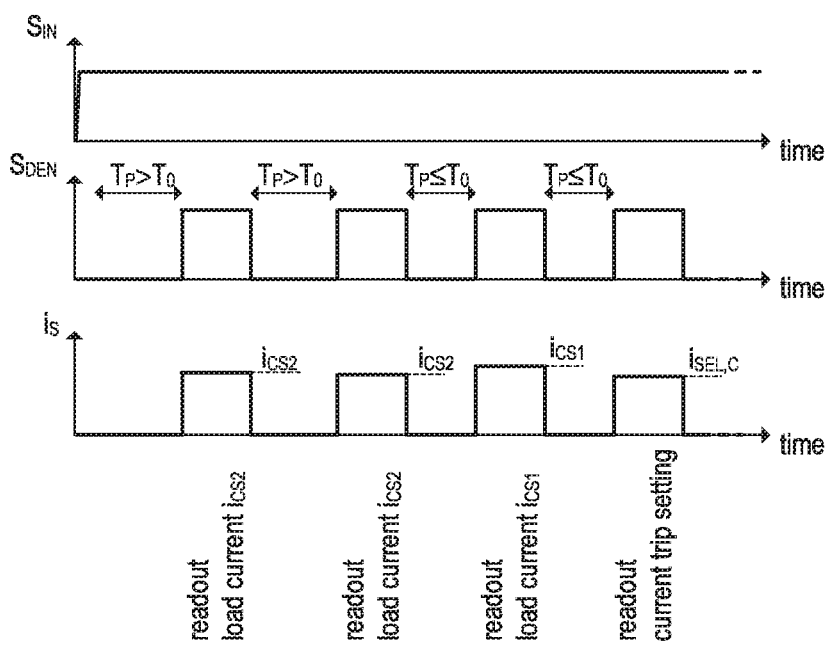
FIG. 15 shows timing diagrams for illustrating the output of different information at one pin of an integrated e-fuse circuit.

The timing diagrams of FIG. 15 illustrate one example of a diagnosis function which may be implemented (inter alia) in the logic circuit 3 and allows an external controller (see, e.g., FIG. 1, microcontroller 8) to read out diagnosis information such as sense currents $i_{CS1}$ or $i_{CS2}$ or other parameters. When the input signal $S_{DEN}$ (diagnosis request signal, "Diagnosis ENable") is set, e.g., to a high level, a diagnosis current is is output at pin IS. The meaning of this diagnosis current is (i.e. the information conveyed by the diagnosis current is) depends on the logic level of input signal $S_{IN}$ and the timing of the high-level pulses of signal $S_{DEN}$. In the example of FIG. 15, exemplary timing diagrams of the input signals $S_{IN}$ and $S_{DEN}$ and the diagnosis current is are shown.

While the input signal $S_{IN}$ is at a high level, which indicates a switch-on of the electronic switch 2 (normal operation), a high level of the diagnosis request signal $S_{DEN}$ causes a diagnosis current is, which is indicative of the load current $i_L$. That is, the multiplexer 91 (see FIGS. 10-13) is controlled such that it outputs the analog current sense signal $i_{CS2}$. As can be seen from FIG. 15, a high level of the diagnosis request signal $S_{DEN}$ causes the diagnosis current $i_S=i_{CS2}$ to be indicative of the load current $i_L$ if the rising edge in the diagnosis request signal $S_{DEN}$ occurs after the diagnosis request signal $S_{DEN}$ has been low for at least a given time period $T_0$ (pulse pause time).

Further information (in addition to the sense current $i_{CS2}$) can be read out if the diagnosis request signal $S_{DEN}$ includes two or more "on-pulses", with the pause(s) between the on-pulses being shorter than the time period $T_0$. In the example of FIG. 15, the third on-pulse in the diagnosis request signal $S_{DEN}$ (second timing diagram of FIG. 15) follows after the second on-pulse with a pause shorter than $T_0$ (pause time $T_P < T_0$) and, therefore, the diagnosis current is output at pin IS is set to be indicative of the sense current $i_{CS1}$ which is provided by the current output DAC 412 (see FIGS. 10-13). Similarly, the fourth (last) on-pulse in the diagnosis request signal $S_{DEN}$ is also asserted after a pause shorter than the given time period $T_0$ and, therefore, the diagnosis current is output at pin IS is set to be indicative of the currently used trip current $i_{TRIP}$ used to trigger an over-current shutdown (comparator 6, see FIG. 7).

Summarizing the above, the diagnosis current generally is controlled dependent on a pulse pattern of the diagnosis request signal $S_{DEN}$ so that the current output circuit sets the value of the diagnosis current is such that it represents the load current (current sense signal $i_{CS2}$, $i_{CS1}$, etc.), the trip current $i_{TRIP}$, or the like.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. An integrated circuit comprising:
a transistor coupled between a supply pin and an output pin;
a current output circuit configured to provide a diagnosis current at a current output pin;
a current sensing circuit coupled to the transistor and configured to generate a first current sense signal indicative of a load current passing through the transistor and a second current sense signal indicative of the load current;
a comparator circuit configured to detect whether the first current sense signal and the second current sense signal are consistent; and
a current source configured to provide a further current which is indicative of an error,
wherein the current output circuit is configured to select, dependent on a control signal, one of the following as the diagnosis current: the first current sense signal and the second current sense signal, wherein the current output circuit is configured to output the further current in response to the comparator circuit detecting that the first current sense signal and the second current sense signal are not consistent, and wherein the further current is an offset current superposed to the first current sense signal or the second current sense signal.

2. The integrated circuit of claim 1,
wherein the current sensing circuit includes analog and digital circuitry and wherein the first current sense signal is generated using digital circuitry and the second current sense signal is generated using analog circuitry only.

3. The integrated circuit of claim 2,
wherein the digital circuitry of the current sensing circuit is configured to provide digital information indicative of the load current, and
wherein the integrated circuit comprises a digital communication interface configured to receive the digital information and to transmit it across a digital communication link.

4. The integrated circuit of claim 1,
wherein the current sensing circuit includes a first sense transistor and a second sense transistor which are coupled to the transistor, the current passing through the first sense transistor being the first current sense signal and the current passing through the second sense transistor being the second current sense signal.

5. The integrated circuit of claim 4,
wherein the current sensing circuit includes a digital-to-analog converter coupled to the first sense transistor and configured to set the current passing through the first sense transistor in accordance with a digital signal, and
wherein the current sensing circuit includes a control circuit configured to modify the digital signal such that the first sense transistor and the transistor approximately operate in the same operating point.

6. The integrated circuit of claim 4,
wherein the current sensing circuit includes a further transistor including a main current path coupled in series to the main current path of the second sense transistor and wherein the current sensing circuit further includes an amplifier which is configured to drive the transistor such that the voltage drop across a main current path of the transistor and the main current path of the second sense transistor is substantially equal.

7. The integrated circuit of claim 1, further comprising:
an input pin for receiving a diagnosis signal,
wherein the control signal which determines the diagnosis current to be selected is dependent on a pulse pattern of the diagnosis signal.

8. The integrated circuit of claim 1, further comprising:
a monitoring circuit configured to generate a protection signal based on the first current sense signal and a preset time-temperature characteristic associated with a wire connected to the output pin.

9. A method comprising:
establishing a load current path between a supply pin and an output pin by activating a transistor;
generating, via a current sensing circuit coupled to the transistor, a first current sense signal indicative of a load current passing through the transistor and a second current sense signal indicative of the load current;
detecting, via a comparator circuit, whether the first current sense signal and the second current sense signal are consistent;
providing, via a current source, a further current which is indicative of an error;
selecting, via a current output circuit and dependent on a control signal, one of the following signals as a diagnostic current: the first current sense signal and the second current sense signal;
providing, via the current output circuit, the selected signal as the diagnosis current at a current output pin; and
outputting, via the current output circuit, the further current in response to the comparator circuit detecting that the first current sense signal and the second current sense signal are not consistent, wherein the further current is an offset current superposed to the first current sense signal or the second current sense signal.

10. The method of claim 9, further comprising:
generating a protection signal based on the first current sense signal and a preset time-temperature characteristic associated with a wire connected to the output pin,
disconnecting the supply pin and the output pin by deactivating a transistor in accordance with the protection signal.

* * * * *